United States Patent
Yang et al.

(10) Patent No.: US 6,627,462 B1
(45) Date of Patent: Sep. 30, 2003

(54) SEMICONDUCTOR DEVICE HAVING A CAPACITOR AND METHOD FOR THE MANUFACTURE THEREOF

(75) Inventors: Woo-Seok Yang, Ichon-shi (KR); Seung-Jin Yeom, Ichon-shi (KR); Yong-Sik Yu, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/605,758

(22) Filed: Jun. 28, 2000

(30) Foreign Application Priority Data

Jun. 28, 1999 (KR) .......................... 1999-25003

(51) Int. Cl.[7] .............................................. H01L 21/00
(52) U.S. Cl. ........................ 438/3; 438/240; 438/627; 438/643
(58) Field of Search ........................ 438/3, 240, 250, 438/253, 254, 396, 397, 398, 393, 622, 625, 627, 642, 643, 653; 257/295, 306–309

(56) References Cited

U.S. PATENT DOCUMENTS

| 5,396,095 A | 3/1995 | Wolters et al. |
| 5,438,023 A | * 8/1995 | Argos, Jr. et al. ............... 438/3 |
| 5,554,559 A | 9/1996 | Wolters et al. |
| 5,624,864 A | 4/1997 | Arita et al. |
| 5,716,875 A | 2/1998 | Jones, Jr. et al. |
| 5,728,603 A | 3/1998 | Emesh et al. |
| 5,960,252 A | 9/1999 | Matsuki et al. |
| 6,144,060 A | * 11/2000 | Park et al. ................... 257/310 |
| 6,287,965 B1 | * 9/2001 | Kang et al. ................. 438/648 |

FOREIGN PATENT DOCUMENTS

| JP | 8-55850 | 2/1996 | ......... H01L/21/316 |
| JP | 11017124 | 1/1999 | ........... H01L/27/10 |
| JP | 11087633 | 3/1999 | ........... H01L/27/10 |

* cited by examiner

*Primary Examiner*—Phat X. Cao
*Assistant Examiner*—Theresa T. Doan
(74) *Attorney, Agent, or Firm*—Jacobson Holman PLLC

(57) ABSTRACT

A semiconductor device for use in a memory cell includes an active matrix provided with a silicon substrate, a transistor formed on the silicon substrate, a capacitor structure formed over the transistor, a metal interconnection for electrically connecting the capacitor structure to the transistor, a barrier layer formed on top of the metal interconnection and an inter-metal dielectric (IMD) layer formed on top of the barrier layer, wherein the barrier layer is made of a material such as $Al_2O_3$ or the like. The IMD layer is formed by using a plasma chemical vapor deposition (CVD) in a hydrogen rich atmosphere, wherein the barrier layer is used for preventing the capacitor structure from the hydrogen.

10 Claims, 9 Drawing Sheets

U.S. 6,627,462 B1

SEMICONDUCTOR DEVICE HAVING A CAPACITOR AND METHOD FOR THE MANUFACTURE THEREOF

FIELD OF THE INVENTION

The present invention relates to a semiconductor device; and, more particularly, to a semiconductor device having a capacitor structure for use in a memory cell and a method for the manufacture thereof.

DESCRIPTION OF THE PRIOR ART

As is well known, a dynamic random access memory (DRAM) with a memory cell comprised of a transistor and a capacitor has a higher degree of integration mainly by down-sizing through micronization. However, there is still a demand for downsizing the area of the memory cell.

To meet the demand, therefore, there have been proposed several methods, such as a trench type or a stack type capacitor, which is arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been proposed a ferroelectric random access memory (FeRAM) where a capacitor thin film with ferroelectric properties such as strontium bithmuth tantalate (SBT) is used for a capacitor in place of a conventional silicon oxide film or a silicon nitride film.

In FIG. 1, there is shown a cross sectional view setting forth a conventional semiconductor memory device 100 for use as FeRAM, disclosed in U.S. Pat. No. 5,864,153, entitled "CAPACITOR STRUCTURE OF SEMICONDUCTOR MEMORY CELL AND FABRICATION PROCESS THEREOF". The semiconductor memory device 100 includes an active matrix 10 incorporating a metal oxide semiconductor (MOS) transistor therein, a capacitor structure 23 formed on top of the active matrix 10, a bit line 34, a metal interconnection 36 and a plate line 38.

In FIGS. 2A to 2E, there are illustrated manufacturing steps involved in manufacturing a conventional semiconductor memory device 100.

The process for manufacturing the conventional semiconductor memory device 100 begins with the preparation of an active matrix 10 having a silicon substrate 2, a MOS transistor formed thereon as a selective transistor, an isolation region 4 and a first insulating layer 16 formed on the MOS transistor and the isolation region 4. The first insulating layer 16, e.g., made of boron-phosphor-silicate glass (BPSG), is formed over the entire surface by chemical vapor deposition (CVD). The MOS transistor includes a pair of diffusion regions 6 serving as a source and a drain, a gate oxide 8, a spacer 14 and a gate line 12.

In a subsequent step, there is formed on top of the active matrix 10 a buffer layer 18, a first metal layer 20, a dielectric layer 22 and a second metal layer 24, sequentially, as shown in FIG. 2A. The buffer layer 18 is made of titanium (Ti) and the first metal layer 20 is made of platinum (Pt). The dielectric layer 22 is made of a ferroelectric material. The buffer, the first and the second metal layers 18, 22, 24 are deposited with a sputter and the dielectric layer 20 is spin-on coated.

Thereafter, the second metal layer 24 and the dielectric layer 22 are patterned into a predetermined configuration. And then, the first metal layer 20 and the buffer layer 18 are patterned into a second predetermined configuration by using a photolithography method to thereby obtain a capacitor structure 23 having a buffer 18A, a bottom electrode 20A, a capacitor thin film 22A and a top electrode 24A, as shown in FIG. 2B. The buffer layer 18A is used for ensuring reliable adhesion between the bottom electrode 20A and the first insulating layer 16.

In a next step, a second insulating layer 26, e.g., made of silicon dioxide ($SiO_2$), is formed on top of the active matrix 10 and the capacitor structure 23 by using a plasma CVD, as shown in FIG. 2C.

In an ensuing step, a first and a second openings 27, 28 are formed in the second and the first insulating layers 26, 16 in such a way that they are placed at positions over the diffusion regions 6, respectively. A third and a fourth openings 30, 32 are formed on top of the capacitor structure 23 through the second insulating layer 26, thereby exposing portions of the bottom and the top electrodes 20A, 24A, respectively, as shown in FIG. 2D.

Thereafter, an interconnection layer, e.g., made of a conducting material such as aluminum (Al), is formed over the entire surface including the interiors of the openings 27, 28, 30, 32, and is patterned to form a bit line 34, a metal interconnection 36 and a plate line 38, thereby obtaining the semiconductor memory device 100, as shown in FIG. 2E.

In case when a multi-level process (not shown) is applied to the above-described semiconductor device 100, an inter-metal dielectric (IMD) layer, e.g., made of $SiO_2$, must be formed on top of the bit line 34, the metal interconnection 36 and the plate line 38 by using a plasma CVD for the purpose of the insulation between each metal layer. Since the plasma CVD utilizes silane ($SiH_4$) as a source gas, the atmosphere for forming the IMD layer becomes a hydrogen rich atmosphere, and in this step, the silicon substrate 2 is annealed at 400° C.

Therefore, the hydrogen gas generated by the plasma CVD process damages the capacitor thin film 22A and the top electrode 24A during the annealing process. That is, the hydrogen gas penetrates to the top electrode 24A, further reaches to the capacitor thin film 22A and reacts with oxygen atoms constituting the ferroelectric material of the capacitor thin film 22A.

Furthermore, after the multi-level process, a passivation layer (not shown), e.g., made of $SiO_2$, is formed thereon by using a plasma CVD. This process also has a hydrogen rich atmosphere. Therefore, the hydrogen gas generated by the passivation process also damages the capacitor structure 23.

These problems, therefore, tend to make it difficult to obtain the desired reproducibility, reliability and yield.

SUMMARY OF THE INVENTION

It is, therefore, an object of the present invention to provide a semiconductor device incorporating hydrogen barrier layers therein to prevent a capacitor thin film, e.g., made of a ferroelectric material, from a hydrogen damage which is caused by a plasma chemical vapor deposition (CVD) during the formation of an inter-metal dielectric layer or a passivation layer.

It is another object of the present invention to provide a method for manufacturing a semiconductor device incorporating hydrogen barrier layers therein to prevent a capacitor thin film from a hydrogen damage which is generated by a plasma CVD during the formation of an inter-metal dielectric layer or a passivation layer.

In accordance with one aspect of the present invention, there is provided a semiconductor device for use in a memory cell, including: an active matrix provided with a semiconductor substrate, a transistor formed on the semiconductor substrate, an isolation region for isolating the transistor and a first insulating layer formed on top of the transistor and the isolation region; a capacitor structure, formed on top of the first insulating layer, composed of a bottom electrode, a capacitor thin film placed on top of the bottom electrode and a top electrode formed on top of the capacitor thin film; a second insulating layer formed on top of the transistor and the capacitor structure; a metal interconnection formed on top of the second insulating layer to electrically connect the transistor to the capacitor structure; a barrier layer formed on top of the metal connection; and an inter-metal dielectric (IMD) layer formed on top of the barrier layer by using a plasma chemical vapor deposition (CVD) in a hydrogen rich atmosphere, wherein the barrier layer is used for preventing the capacitor structure from the hydrogen.

In accordance with another aspect of the present invention, there is provided a method for manufacturing a semiconductor device for use in a memory cell, the method comprising the steps of: a) preparing an active matrix provided with a transistor and a first insulating layer formed around the transistor; b) forming a capacitor structure on top of the first insulating layer, wherein the capacitor structure includes a capacitor thin film made of a ferroelectric material; c) forming a first metal layer and patterning a first metal layer into a first predetermined configuration to electrically connect the transistor to the capacitor structure; d) a first barrier layer on top of the patterned first metal layer; and e) an inter-metal dielectric (IMD) layer formed on top of the first barrier layer by using a plasma chemical vapor deposition (CVD) in a hydrogen rich atmosphere, wherein the barrier layer is used for preventing the capacitor structure from the hydrogen.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENT

Figure 1:
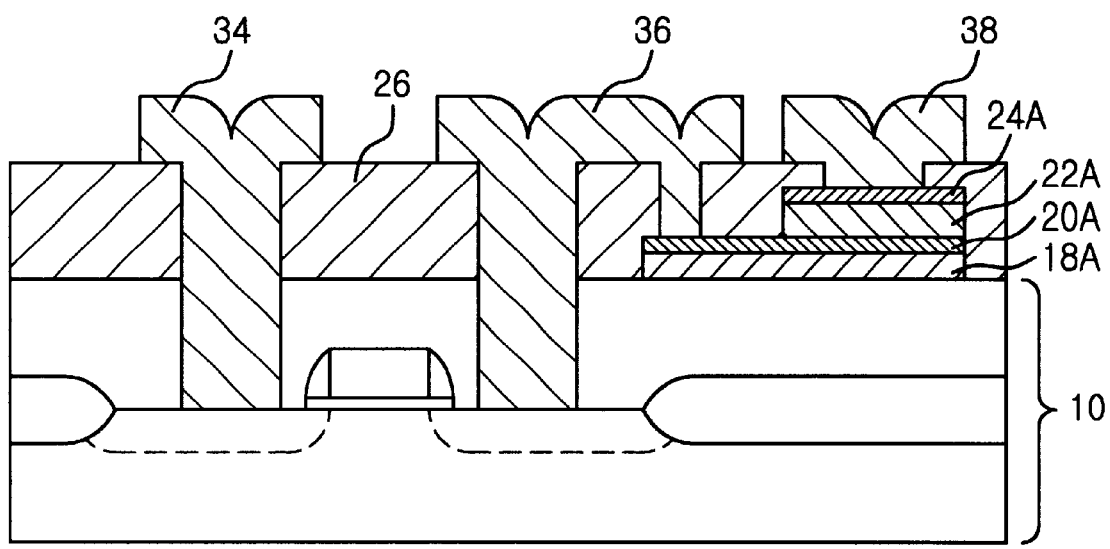
FIG. 1 shows a cross sectional view representing a prior art semiconductor memory device having a capacitor structure.
Figure 2A:
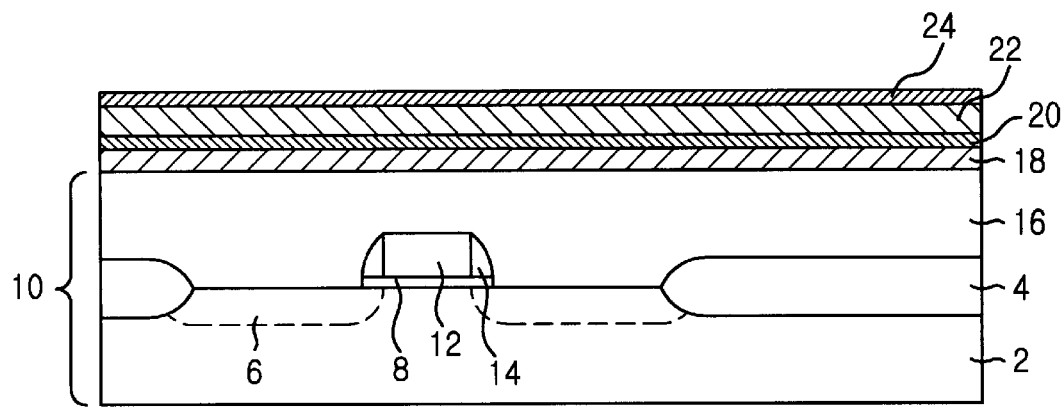
FIGS. 2A to 2E are schematic cross sectional views illustrating a prior art method for the manufacture of a semiconductor memory device.
Figure 2B:
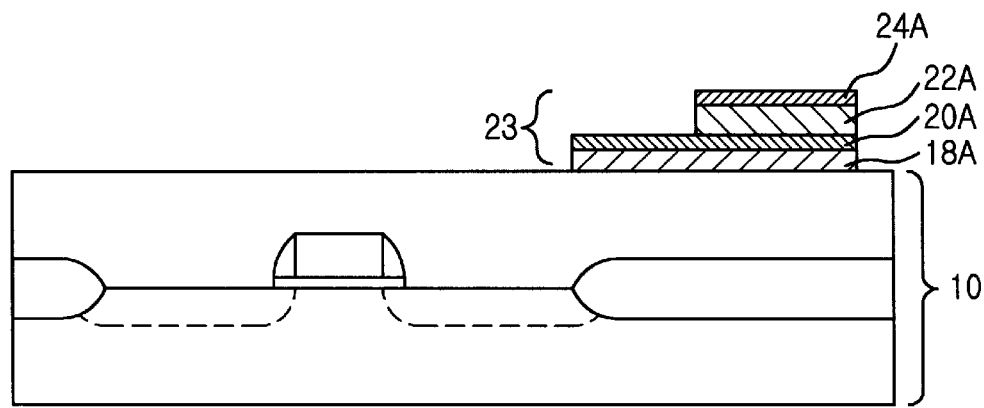
Figure 2C:
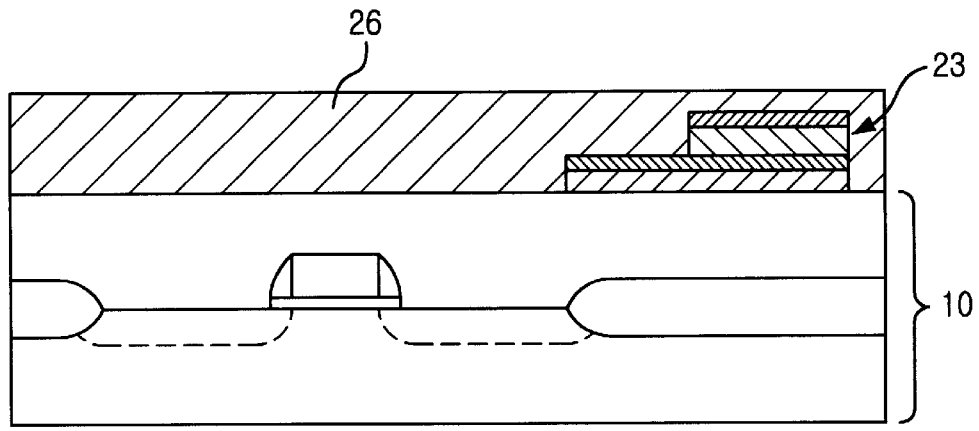
Figure 2D:
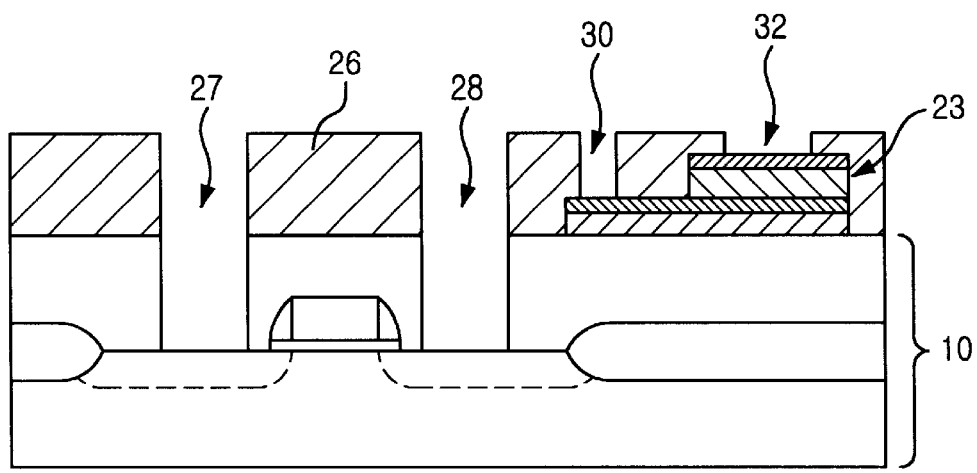
Figure 2E:
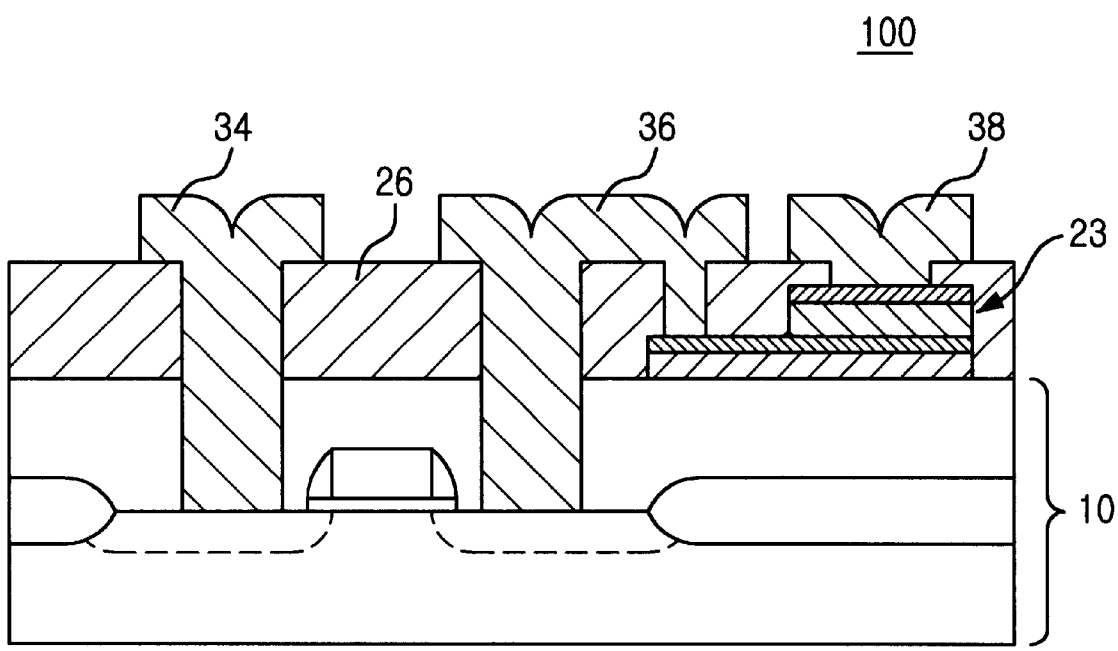

There are provided in FIGS. 3 and 4A to 4H a cross sectional view of a semiconductor device 200 for use in a memory cell and cross sectional views setting forth a method for the manufacture thereof in accordance with preferred embodiments of the present invention. It should be noted that like parts appearing in FIGS. 3 and 4A to 4H are represented by like reference numerals.

Figure 3:
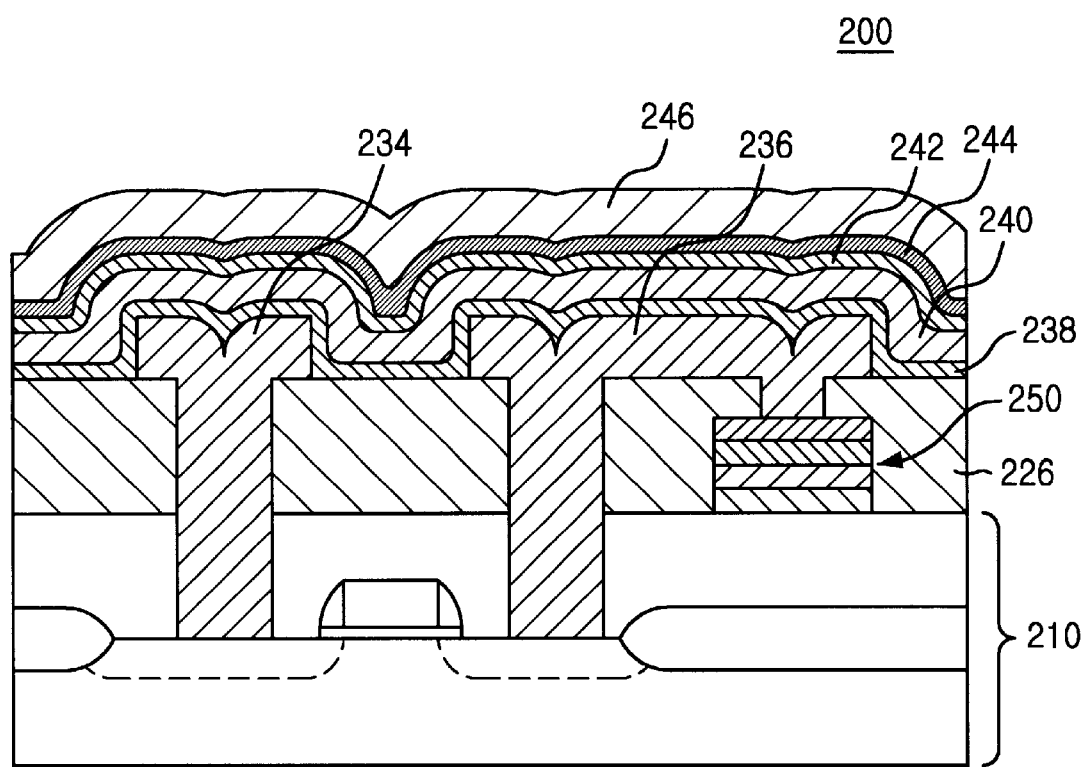
FIG. 3 is a cross sectional view setting forth a semiconductor device in accordance with the present invention.

In FIG. 3, there is provided a cross sectional view of the inventive semiconductor device 200 comprising an active matrix 210, a second insulating layer 226, a bit line 234, a metal interconnection 236, a first barrier layer 238, an inter-metal dielectric (IMD) layer 240 and a capacitor structure 250. The IMD layer 240, e.g., made of SiOx, is disposed between the first barrier layer 238 and the bit line 234 and the metal interconnection 236, wherein the IMD layer 240 is formed by using a plasma chemical vapor depodition (CVD) in a hydrogen rich atmosphere. The plasma CVD is carried out at a low temperature by using silane ($SiH_4$) as a source gas. It is preferable that the first barrier layer 238 is made of a material such as $Al_2O_3$ and has a thickness ranging from approximately 50 Å to approximately 150 Å. In the preferred embodiment, the first barrier layer 238 is formed by using a method such as an atomic layer deposition (ALD) method. Specifically, the ALD method is carried out as follows: a layer of trimethyl aluminum (TMA) is formed on top of the bit line 234, a metal interconnection 236 and the second insulating layer 226 in a low temperature, e.g., approximately 350° C.; and the layer is oxidized by using $H_2O$ as a source gas and using N2 as a purge gas, thereby obtaining a layer of $Al_2O_3$.

In addition, the semiconductor device 200 further includes a third metal layer 242 formed on top of the IMD layer 240, a second barrier layer 244 formed on top of the third metal layer 242 and a passivation layer 246 formed on top of the second barrier layer 244. The passivation layer 246 is formed by using a plasma CVD in a hydrogen rich atmosphere. In the preferred embodiment, the second barrier layer 244, e.g., made of a material such as $Al_2O_3$, is formed by using a method such as an ALD method to prevent the capacitor structure 250 from the hydrogen.

In the semiconductor device 200, the bit line 234 is electrically connected to one of the diffusion regions 206 and the top electrode 224A is electrically connected to the other diffusion region 206 through the metal interconnection 236, wherein the bit line 234 and the metal interconnection 236 are electrically disconnected each other. The bottom electrode 220A may be connected to a plate line (not shown) to apply a common constant potential thereto.

FIGS. 4A to 4H are schematic cross sectional views setting forth the method for manufacture of a semiconductor memory device 200 in accordance with the present invention.

Figure 4A:
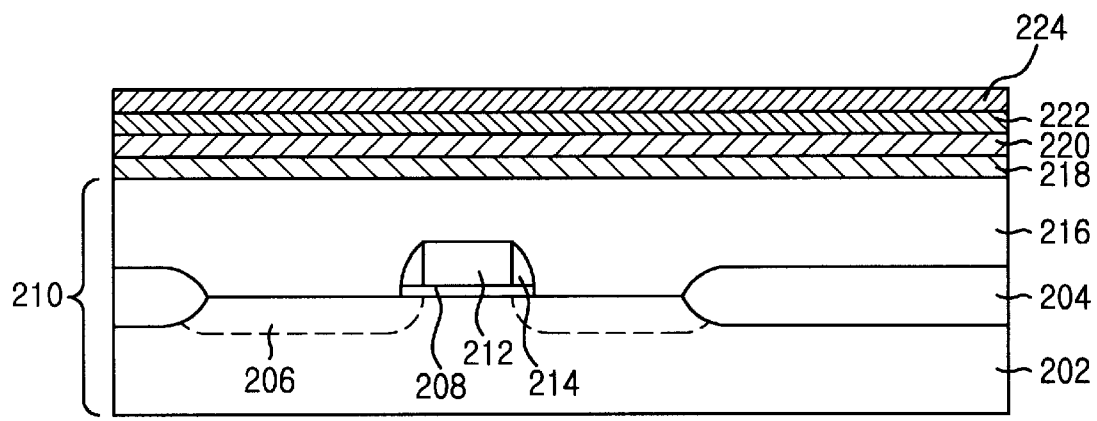
FIGS. 4A to 4H are schematic cross sectional views setting forth a method for the manufacture of the semiconductor memory device in accordance with the present invention.

The process for manufacturing the semiconductor device 200 begins with the preparation of an active matrix 210 including a semiconductor substrate 202, an isolation region 204, diffusion regions 206, a gate oxide 208, a gate line 212, a spacer 214 and a first insulating layer 216, as shown in FIG. 4A. One of the diffusion regions 206 serves as a source and the other diffusion region 206 serves as a drain. The first insulating layer 216 is made of a material, e.g., boron-phosphor-silicate glass (BPSG).

Thereafter, a buffer layer 218, e.g., made of Ti or TiOx, is formed on top of the first insulating layer 216. And, a first metal layer 220, a dielectric layer 222 and a second metal layer 224 are formed on top of the buffer layer 218, subsequently. In the preferred embodiment, the metal layers 220, 224 can be made of a material including, but not limited to: platinum (Pt), IrOx, RuOx or the like. The dielectric layer 222 is made of a ferroelectric material such as SBT, PZT or the like and formed by using a method such as a spin coating, a chemical vapor deposition (CVD) or the like.

Figure 4B:
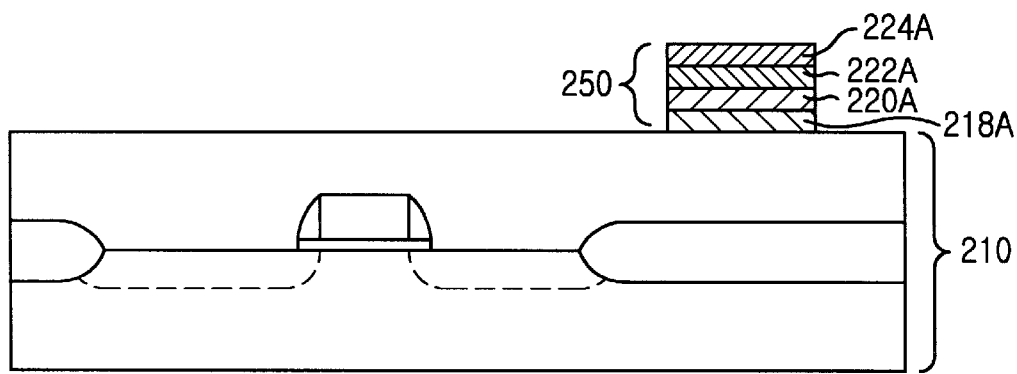

As shown in FIG. 4B, the second metal layer 224 and the dielectric layer 222 are patterned into a first predetermined configuration to obtain a top electrode 224A and a capacitor thin film 222A. And then, the first metal layer 220 and the buffer layer 218 are patterned into a second predetermined configuration to obtain a bottom electrode structure, thereby forming a capacitor structure 250 having a buffer 218A, a bottom electrode 220A, a capacitor thin film 222A and a top electrode 224A. It is preferable that the bottom electrode 220A has a size different from that of the top electrode 228A in order to form a plate line (not shown) during the following processes.

Figure 4C:
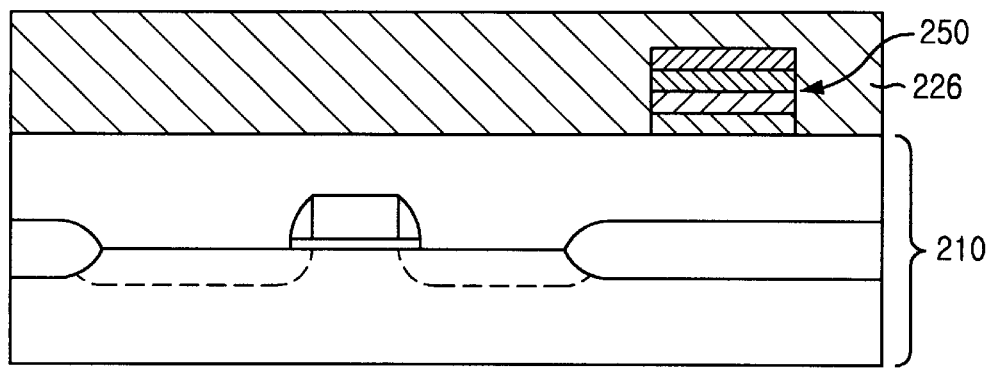

Thereafter, a second insulating layer 226, e.g., made of a material, e.g., BPSG, is formed on top of the capacitor structure 250 and the first insulating layer 216 by using a method such as CVD and made flat by means of chemical mechanical polishing (CMP), as shown in FIG. 4C.

Figure 4D:
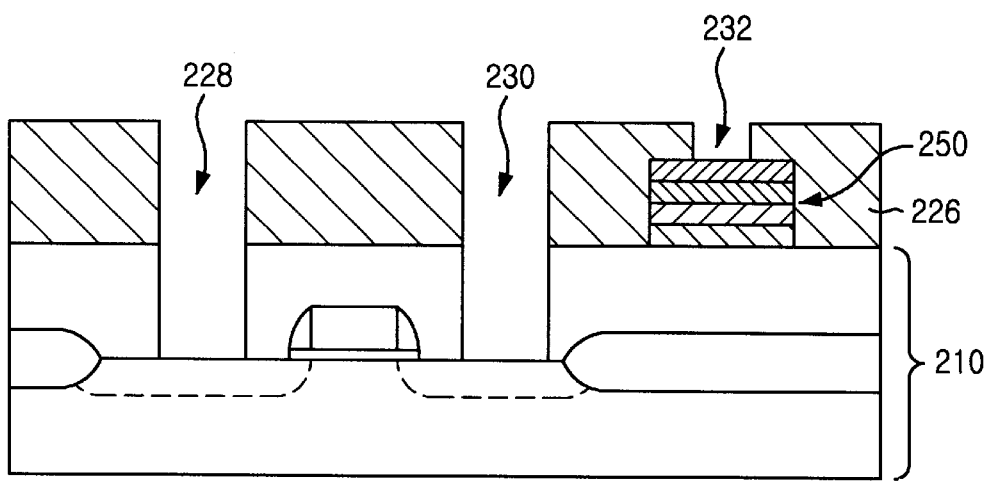

As shown in FIG. 4D, a first and a second openings 228, 230 are formed at positions over the diffusion regions 206 through the second and the first insulating layers 226, 216 by using a method such as a photolithography or a plasma etching, e.g., reactive ion etching (RIE). And, a third opening 232 is formed at a position over the capacitor structure 250 through the second insulating layer 226 by using a method such as a photolithography or a plasma etching.

Figure 4E:
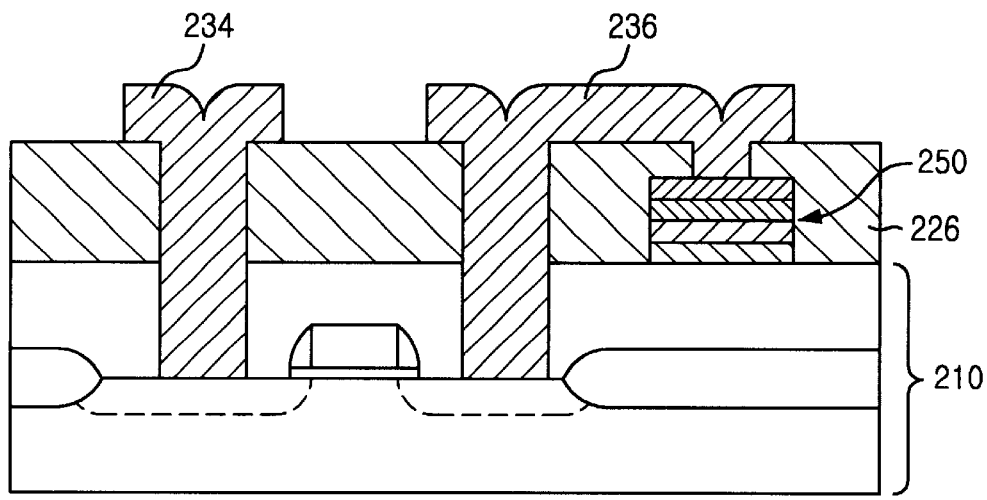

As shown in FIG. 4E, an interconnection metal layer, e.g., made of Al, is formed over the entire surface including the interiors of the openings 228, 230, 232 and is patterned into a preset configuration to form a bit line 234 and a metal interconnection 236.

Figure 4F:
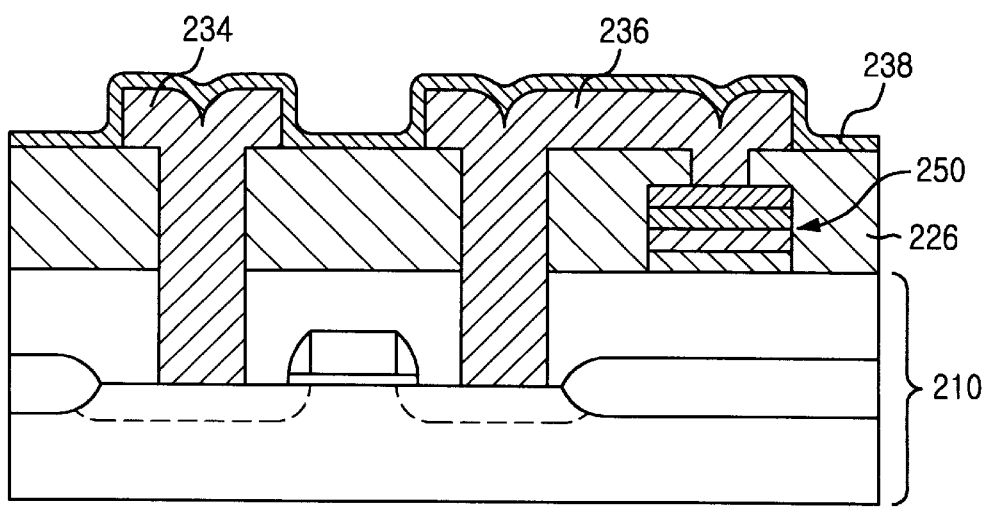

In a following step, a first barrier layer 238, e.g., made of $Al_2O_3$, is formed on top of the bit line 234, the metal interconnection 236 and the second insulating layer 226 by using a method such as a ALD method, as shown in FIG. 4F. The ALD method is carried out as follows: a layer of TMA is formed on top of the bit line 234, the metal interconnection 236 and the second insulating layer 226 in a low temperature, e.g., approximately 350° C.; and the layer of TMA is oxidized by using $H_2O$ as a source gas and $N_2$ as a purge gas, thereby obtaining a layer of $Al_2O_3$. The ALD method can be carried out by using a four cyclic deposition, which includes the steps of: flowing TMA gas in a first predetermined time; flowing $N_2$ purge gas in a second predetermined time; flowing $H_2O$ oxidation gas in a third predetermined time; and flowing $N_2$ purge gas in a fourth predetermined time. It is preferable that the first barrier layer has a thickness ranging from approximately 50 Å to approximately 150 Å.

Figure 4G:
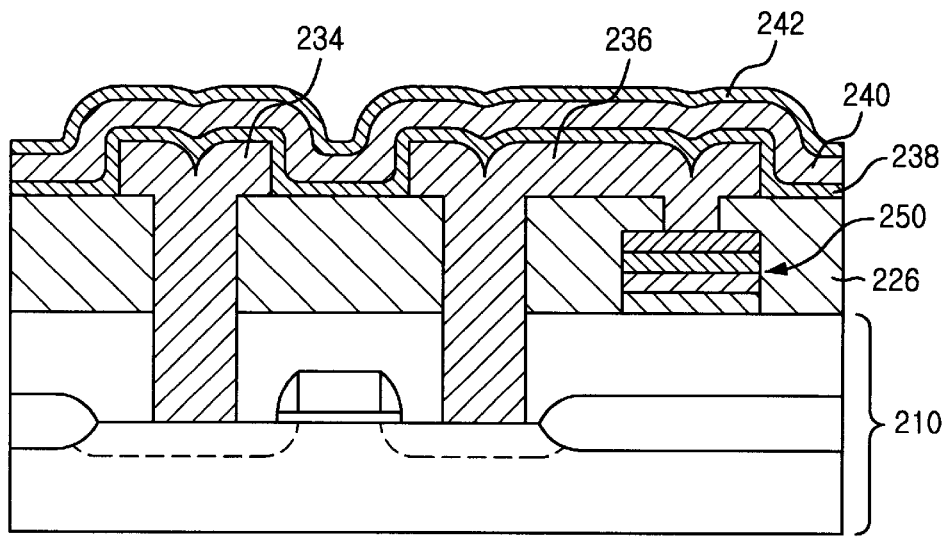

In an ensuing step, as shown in FIG. 4G, an inter-metal dielectric layer (IMD) 240, e.g., made of a oxide material such as $SiO_2$, is formed on top of the first barrier layer 238 by using a method such as a plasma CVD. The plasma CVD is carried out at a low temperature by using $SiH_4$ as a source gas. And then, a third metal layer 242, e.g., made of Al, is formed on top of the IMD layer 240 to apply a multi-level process. In the figures, each of the layers 216, 226, 240 is shown as that having a single layer structure for simplification.

Figure 4H:
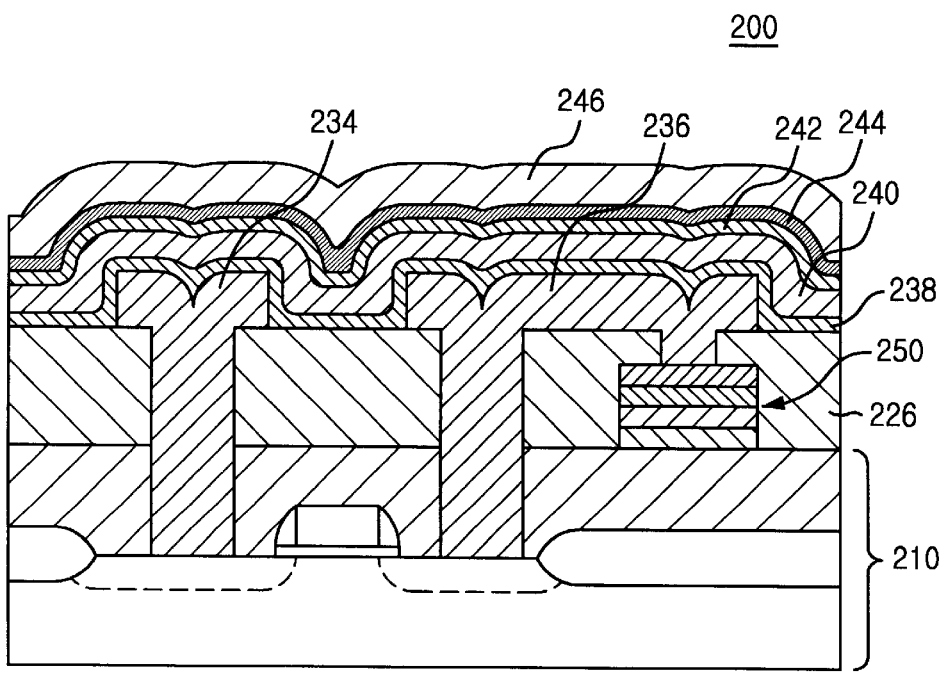

Thereafter, as shown in FIG. 4H, a second barrier layer 244, e.g., made of $Al_2O_3$, is formed on top of the third metal layer 242 by using a method such as an ALD method. The ALD method of the second barrier layer 244 is similar to that of the first barrier layer 238. It is preferable that the second barrier layer 244 has a thickness ranging from approximately 50 Å to approximately 150 Å.

In an ensuing step, a passivation layer 246, e.g., made of $Si_3N_4$, is formed on top of the second barrier layer 244 by using a method such as a plasma CVD to protect the semiconductor device 200 from an external detrimental envelopment such as moisture, particles or the like.

In comparison with the prior art, the present invention prevents a capacitor structure 250 from hydrogen damages caused by the formations of an IMD and a passivation layers. This is achieved by utilizing barrier layers, which will not penetrate a hydrogen gas into the capacitor structure 250.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device for use in a memory cell, the method comprising the steps of:
   a) preparing an active matrix provided with a transistor and a first insulating layer formed around the transistor;
   b) forming a capacitor structure on top of the first insulating layer, wherein the capacitor structure includes a capacitor thin film made of a ferroelectric material;
   c) forming a first metal layer and patterning a first metal layer into a first predetermined configuration to electrically connect the transistor to the capacitor structure;
   d) forming a first barrier layer on top of and in direct contact with the patterned first metal layer;
   e) forming an inter-metal dielectric (IMD) layer formed on top of the first barrier layer by using a plasma chemical vapor deposition (CVD) in a hydrogen rich atmosphere, wherein the barrier layer is used for preventing the capacitor structure from the hydrogen;
   f) forming a second metal layer formed on top of the IMD layer;
   g) forming a second barrier layer formed on top of the second metal layer;
   h) forming a passivation layer formed on top of an additional barrier layer by using a plasma CVD in a hydrogen rich atmosphere, wherein the additional barrier layer is used for preventing the capacitor structure from the hydrogen.

2. The method of claim 1, wherein the capacitor thin film is made of a material selected from a group consisting of SBT, PZT or the like.

3. The method of claim 2, wherein the IMD layer is made of a oxide material such as $SiO_2$.

4. The method of claim 3, wherein the plasma CVD is carried out at a low temperature by using $SiH_4$ as a source gas.

5. The method of claim 4, wherein the first barrier layer is made of a material such as $Al_2O_3$.

6. The method of claim 5, wherein the first barrier layer has a thickness ranging from approximately 50 Å to approximately 150 Å.

7. The method of claim 6, wherein the first barrier layer is formed by using an ALD method.

8. The method of claim 7, wherein the ALD method is carried out by using TMA and $H_2O$ as a source gas and using $N_2$ as a purge gas.

9. The method of claim 1, wherein the second barrier layer is made of a material such as $Al_2O_3$.

10. The semiconductor device of claim 9, wherein the step g) is carried out by using an ALD method.

* * * * *